US006946383B2

(12) United States Patent
Harada (10) Patent No.: US 6,946,383 B2
(45) Date of Patent: *Sep. 20, 2005

(54) METHOD FOR FORMING WIRING STRUCTURE WHICH INCLUDES ANNEALING CONDUCTIVE FILM BEFORE AND AFTER REMOVAL OF A PORTION OF THE CONDUCTIVE FILM (75) Inventor: Takeshi Harada, Shiga (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/448,095

(22) Filed: May 30, 2003

(65) Prior Publication Data

US 2003/0224592 A1 Dec. 4, 2003

(30) Foreign Application Priority Data

May 31, 2002 (JP) ........................................ 2002-159098

(51) Int. Cl.⁷ .......................................... H01L 21/4763
(52) U.S. Cl. ...................... 438/622; 438/633; 438/637; 438/638; 438/687
(58) Field of Search ................................. 438/622, 633, 438/637–640, 687, 691–693, 675, 672, 625, 629

(56) References Cited

U.S. PATENT DOCUMENTS

| 6,218,302 | B1 |   | 4/2001  | Braeckelmann et al. |
|-----------|----|---|---------|---------------------|
| 6,242,349 | B1 | * | 6/2001  | Nogami et al. ............. 438/687 |
| 6,391,777 | B1 | * | 5/2002  | Chen et al. ................. 438/687 |
| 2003/0160326 | A1 | * | 8/2003 | Uzoh et al. ................. 257/758 |
| 2003/0232498 | A1 | * | 12/2003 | Harada ....................... 438/637 |
| 2004/0052930 | A1 | * | 3/2004  | Basol et al. ................. 427/58 |

FOREIGN PATENT DOCUMENTS

| JP | 11-186261   | 7/1999  |
| JP | 2000-277520 | 10/2000 |

* cited by examiner

Primary Examiner—Thanh Nguyen
(74) Attorney, Agent, or Firm—McDermott Will & Emery LLP (57) ABSTRACT

A recess is formed in an insulating film, and then a conductive film is deposited over the insulating film so as to fill the recess. Thereafter, the conductive film is subjected to a first heat treatment. Subsequently, part of the conductive film located outside the recess is removed, and then the remaining part of the conductive film is subjected to a second heat treatment with the surface thereof exposed.

19 Claims, 8 Drawing Sheets

METHOD FOR FORMING WIRING STRUCTURE WHICH INCLUDES ANNEALING CONDUCTIVE FILM BEFORE AND AFTER REMOVAL OF A PORTION OF THE CONDUCTIVE FILM

BACKGROUND OF THE INVENTION

The present invention relates to methods for forming wiring structures in electronic devices such as semiconductor devices.

Examples of known methods for forming wiring structures include a first prior art (see, for example, Japanese Laid-Open Publication No. 2000-277520) in which heat treatment (hereinafter, referred to as annealing) is performed before a chemical mechanical polishing (CMP) process and a second prior art (see, for example, Japanese Laid-Open Publication No. 11-186261) in which annealing is performed after a CMP process. Hereinafter, these two major known methods for forming wiring structures will be described with reference to the drawings with the case where wire is formed in a wiring groove formed in an insulating film taken an example.

FIGS. 9A through 9F are cross-sectional views showing respective process steps of a method for forming a wiring structure according to the first prior art in which "annealing" is performed "before a CMP process".

Figure 9A:
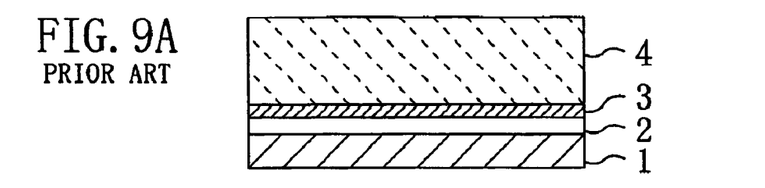
FIGS. 9A through 9F are cross-sectional views showing respective process steps of a method for forming a wiring structure according to a first prior art.

First, as shown in FIG. 9A, a $SiO_2$ insulating film 2 is deposited over a substrate 1, and then an etch stopper film 3 is formed. Subsequently, an interlayer dielectric film 4 of SiOF is formed. As will be described later, a groove for burying copper therein is provided in the interlayer dielectric film 4.

Figure 9B:
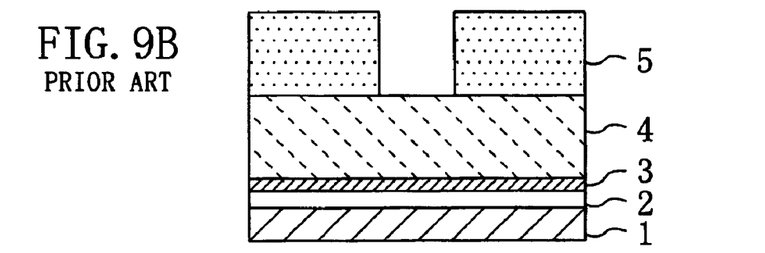

Next, as shown in FIG. 9B, a photoresist is applied onto the interlayer dielectric film 4, and then exposed to light and dissolved with a developer, leaving a resist mask 5 having an opening in its wiring groove region.

Figure 9C:
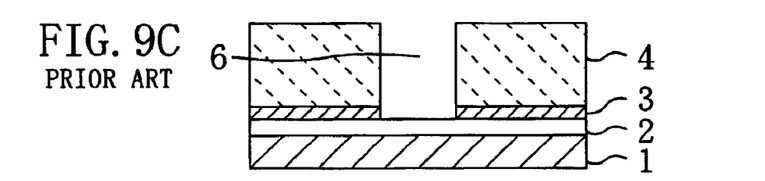

Thereafter, the interlayer dielectric film 4 is etched using the resist mask 5, thereby forming a groove 6 as shown in FIG. 9C. Then, the resist mask 5 is removed.

Figure 9D:
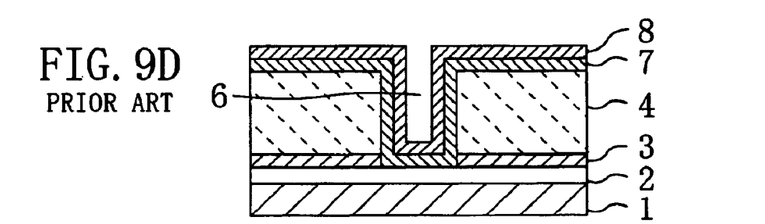

Subsequently, as shown in FIG. 9D, a barrier film 7 and a Cu sputtering film 8 are deposited in this order with a sputtering process over the substrate 1 having a groove pattern.

Figure 9E:
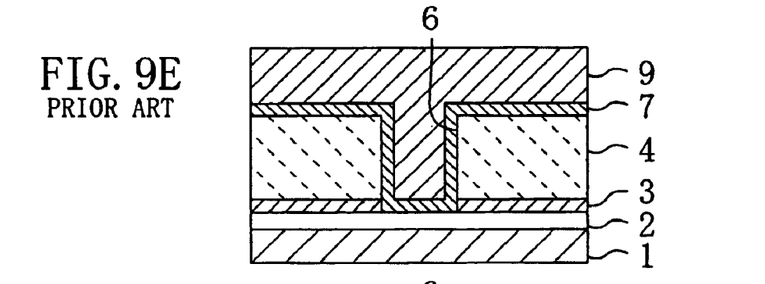

Then, as shown in FIG. 9E, a Cu plating film 9 is formed by, for example, an electrolytic plating process to fill the groove 6 completely. Subsequently, the Cu plating film 9 is annealed at a temperature of about 250 to 400° C. In this manner, the Cu sputter film 8 is merged with the Cu plating film 9.

Figure 9F:
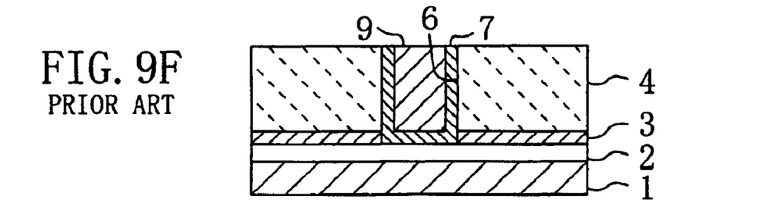

Thereafter, as shown in FIG. 9F, respective parts of the Cu plating film 9 and the barrier film 7 located outside the groove 6 are removed with a CMP process, thereby exposing the surface of the interlayer dielectric film 4 as well as planalizing the respective surfaces of the interlayer dielectric film 4 and of the remaining part of the Cu plating film 9. In this manner, a copper wire made of copper buried in the groove 6 is formed.

FIGS. 10A through 10E are cross-sectional views showing respective process steps of a method for forming a wiring structure according to the second prior art in which "annealing" is performed "after a CMP process".

Figure 10A:
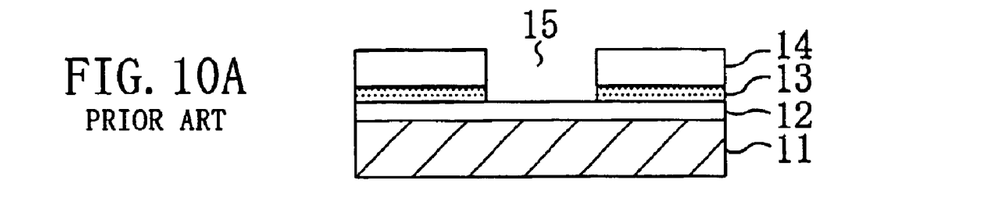
FIGS. 10A through 10E are cross-sectional views showing respective process steps of a method for forming a wiring structure according to a second prior art.

First, as shown in FIG. 10A, an underlying oxide film 12 is deposited by a plasma CVD (chemical vapor deposition) process over a silicon substrate 11, and then a SiN film 13 and a $SiO_2$ film 14 are deposited in this order with similar processes. Subsequently, the $SiO_2$ film 14 is etched using a resist pattern (not shown) as a mask, thereby forming a recess reaching the SiN film 13. Thereafter, the resist pattern and exposed part of the SiN film 13 are removed, thereby forming a wiring groove 15.

Figure 10B:
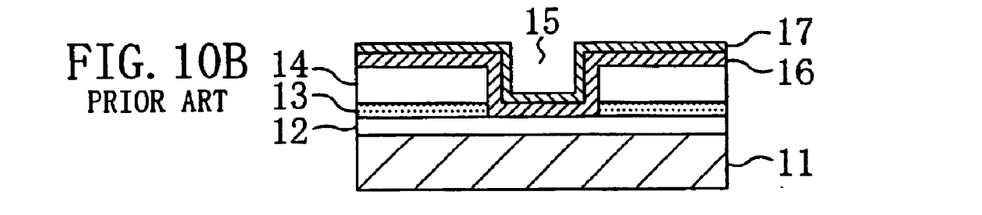

Next, as shown in FIG. 10B, a barrier metal TaN film 16 is deposited by a sputtering process over the $SiO_2$ film 14 provided with the wiring groove 15, and then a Cu seed film 17 is deposited over the barrier metal TaN film 16.

Figure 10C:
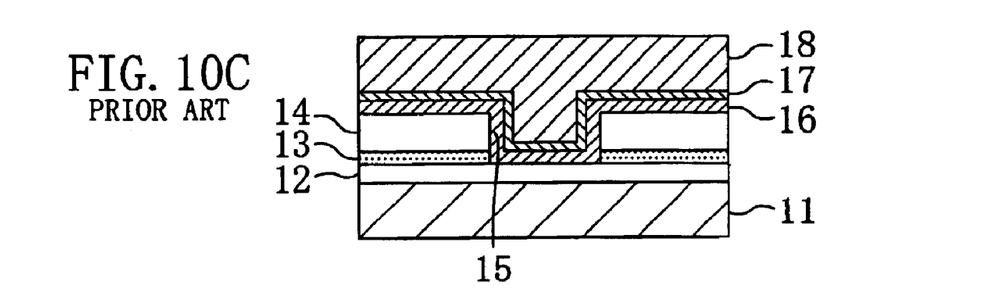

Thereafter, as shown in FIG. 10C, a Cu plating layer 18 is deposited by an electrolytic plating process over the $SiO_2$ film 14 to fill the wiring groove 15 completely.

Figure 10D:
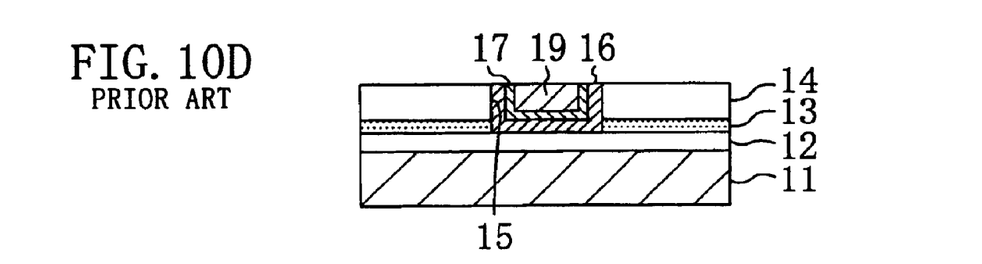

Subsequently, as shown in FIG. 10D, respective parts of the Cu plating layer 18, Cu seed film 17 and barrier metal TaN film 16 located outside the wiring groove 15 are removed by a CMP process, thereby exposing the surface of the $SiO_2$ film 14. In this manner, a Cu buried wiring layer 19 is formed in the wiring groove 15.

Figure 10E:
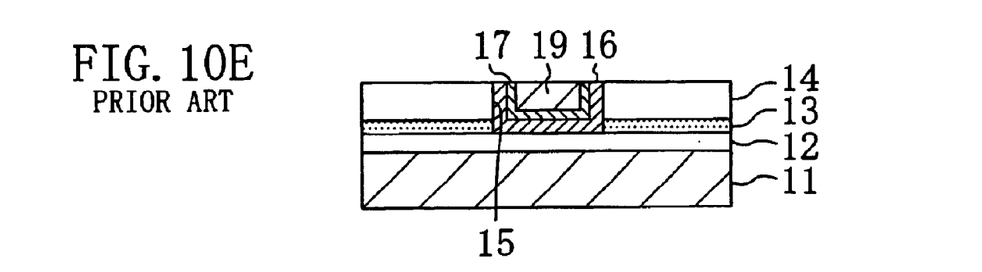

Then, an annealing process is performed at a temperature of 300 to 500° C. for a holding time of 5 to 2000 seconds, thereby eliminating, for example, moisture, hydrogen and carbon dioxide contained in the Cu buried wiring layer 19 as well as increasing the grain size of the Cu buried wiring layer 19, as shown in FIG. 10E.

Through the foregoing process steps, a copper wire for a semiconductor device is formed.

However, the first and second prior arts have problems described later.

Figure 11:
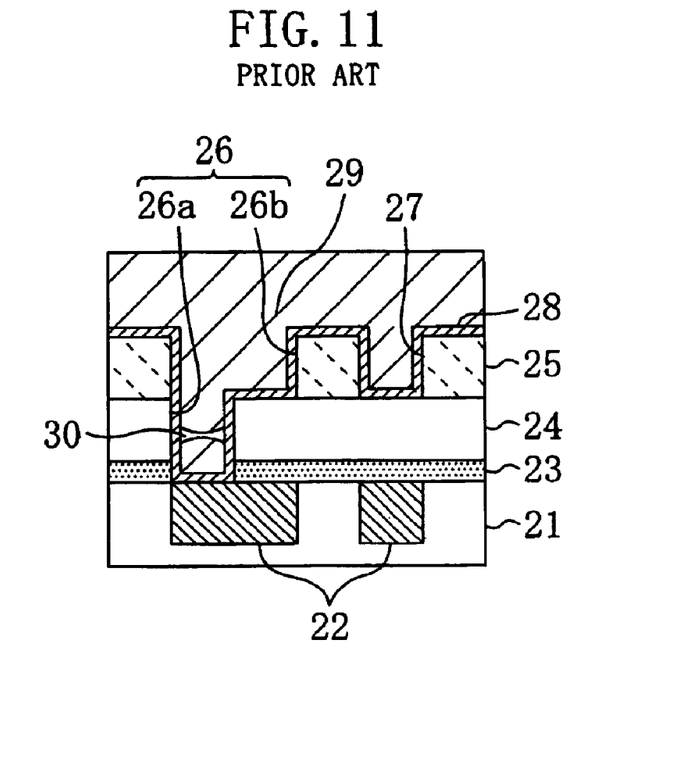
FIG. 11 is a view for explaining problems in the first prior art.

FIG. 11 is a view for explaining problems in the first prior art.

As shown in FIG. 11, a SiN film 23, a $SiO_2$ film 24 and a FSG film (fluorine-doped silicon oxide film) 25 are formed in this order over an insulating film 21 in which a lower wiring layer 22 is buried. The SiN film 23, the $SiO_2$ film 24 and the FSG film 25 are provided with a recess 26 and a wiring groove 27. More specifically, the recess 26 is made up of: a via hole 26a formed through the SiN film 23 and the $SiO_2$ film 24 to reach the lower wiring layer 22; and a wiring groove 26b formed in the FSG film 25 and connected to the via hole 26a. The wiring groove 27 is also formed in the FSG film 25 in the same manner as the wiring groove 26b. A barrier film 28 is formed over the FSG film 25 to fill the recess 26 and the wiring groove 27 halfway. A copper film (a conducive film for upper wiring layer) 29 is further formed over the barrier film 28 to fill the recess 26 and the wiring groove 27 completely.

In the method for forming the wiring structure according to the first prior art, "annealing" is performed "before the CMP process". Specifically, the copper film 29 is annealed before the CMP process for removing part of the copper film 29 that extends off the recess 26 and the wiring groove 27. However, in the first prior art, the annealing performed on the copper film 29 causes a problem that a void (cavity) 30 is created in the copper film to be a metal wiring layer as shown in FIG. 11.

The void 30 is considered to be created because of the following reasons. That is to say, in the first prior art in which "annealing" is performed "before the CMP process", an annealing process is performed at a relatively high temperature of 250 to 400° C. before a CMP process in a state that the copper film 29 has a high volume. Accordingly, defects (e.g., vacancies at the atomic level existing along a grain boundary) contained in the copper film 29 just after the annealing gather in the via hole 26a, and in addition, the crystal growth of the copper film 29 is completed while these defects are not eliminated completely. This causes a void 30 in a narrow portion such as a via hole as shown in FIG. 11. As a result, the wiring resistance increases, thus reducing the yield of the semiconductor device and also degrading the reliability of the semiconductor device. Such a phenomenon is more remarkable when the width of a recess such as the wiring groove or via hole is 0.25 μm or less.

Figure 12:
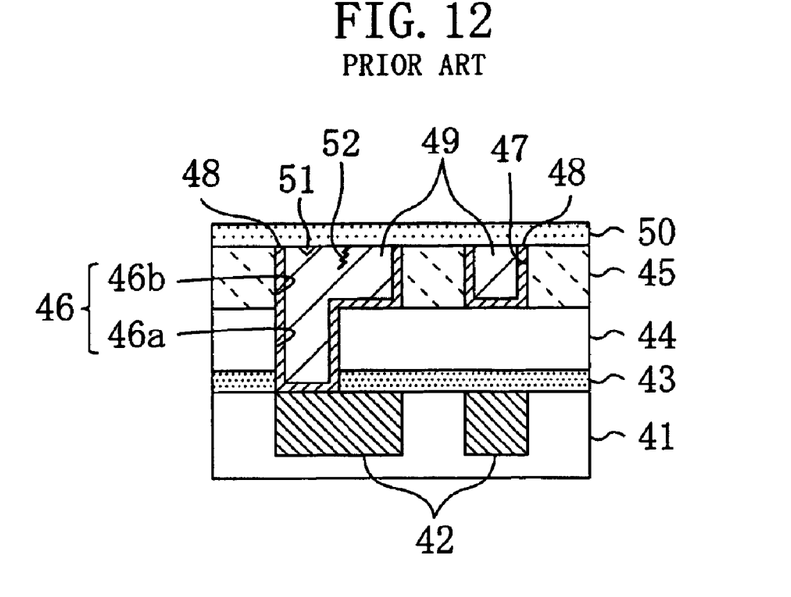
FIG. 12 is a view for explaining problems in the second prior art.

FIG. 12 is a view for explaining problems in the second prior art.

As shown in FIG. 12, a SiN film 43, a $SiO_2$ film 44 and a FSG film 45 are formed in this order over an insulating film 41 in which a lower wiring layer 42 is buried. The SiN film 43, the $SiO_2$ film 44 and the FSG film 45 are provided with a recess 46 and a wiring groove 47. More specifically, the recess 46 is made up of: a via hole 46a formed through the SiN film 43 and the $SiO_2$ film 44 to reach the lower wiring layer 42; and a wiring groove 46b formed in the FSG film 45 and connected to the via hole 46a. The wiring groove 47 is also formed in the FSG film 45 as the wiring groove 46b. The recess 46 and the wiring groove 47 are filled with a copper film (a conducive film for upper wiring layer) 49 with a barrier film 48 interposed between the recess 46 or wiring groove 47 and the copper film 49. A SiN film 50 is formed on the FSG film 45 and the copper film 49.

According to the method for forming the wiring structure of the second prior art, "annealing" is performed "after the CMP process". Specifically, the copper film 49 is annealed after the CMP process for removing part of the copper film 49 that extends off the recess 46 and the wiring groove 47. However, in the second prior art, the annealing performed on the copper film 49 causes a problem that a surface fracture 51 and a crack 52 are created in the surface of the copper film 49 buried in, for example, the recess 46, as shown in FIG. 12.

The surface fracture 51 and the crack 52 are considered to be created because of the following reasons. That is to say, in the second prior art in which "annealing" is performed "after the CMP process", the copper film 49 buried in, for example, the recess 46 is annealed to have its crystal growth completed. Accordingly, defects contained in the copper film 49 gather in the surface of the copper film 49, which has been already planarized, and at the same time, the copper film 49 shrinks unevenly. This causes a surface fracture 51 and a crack 52 as shown in FIG. 12. Although the SiN film 50 is deposited over the entire surface of the wiring structure including the copper film 49 after the formation of the structure in the second prior art, the surface fracture 51 and the crack 52 are not filled with the SiN film 50 because the SiN film 50 has a low step coverage. Therefore, the surface defects such as the surface fracture 51 created in the surface of the copper film 49 to be a wire are left without being treated. As a result, these surface defects act as paths for surface diffusion of copper atoms, thus greatly deteriorating resistance to electromigration.

SUMMARY OF THE INVENTION

It is therefore an object of the present invention to provide a method for fabricating an electronic device such as a semiconductor device with a wiring structure including neither a void nor a surface fracture.

In order to achieve this object, the present inventor has come up with a method for preventing the occurrence of drawbacks such as a void or a surface fracture by performing "annealing" separately "before and after a CMP process" for stepwise removal of defects contained in a conductive film to suppress the agglomeration of the defects in the conductive film that occurs in the inside or the surface of wiring during or after the annealing processes.

Specifically, an inventive method for forming a wiring structure includes the steps of: forming a recess in an insulating film; depositing a conductive film over the insulating film such that the recess is filled with the conductive film; subjecting the conductive film to a first heat treatment; removing part of the conductive film located outside the recess, after the first heat treatment has been performed; and subjecting the remaining part of the conductive film to a second heat treatment with the surface thereof exposed, after the part of the conductive film located outside the recess has been removed.

With the inventive method for forming a wiring structure, after a conductive film has been deposited to fill a recess provided in an insulating film, the conductive film is subjected to a first heat treatment, and then part of the conductive film outside the recess is removed. Thereafter, the remaining part of the conductive film, i.e., part of the conductive film buried in the recess, is subjected to a second heat treatment, thereby completing a wire made of the conductive film. That is to say, in the inventive method for forming a wiring structure, annealing is performed at least one time before and at least one time after the process step for removing part of the conductive film (buried wire material) outside the recess (hereinafter, referred to as a removing step). Therefore, defects contained in the conductive film can be gradually eliminated. Specifically, by performing annealing (first heat treatment) before the removing step with the crystal growth of the conductive film suppressed, it is possible to suppress the agglomeration of defects occurring in the part of the conductive film inside the recess, thereby preventing a void from occurring. In addition, defects in the conductive film are partially eliminated by the annealing process before the removing step so that the amount of defects contained in the part of the conductive film inside the recess is reduced, and then the removing step and annealing (the second heat treatment) are performed in this order. That is to say, after the amount of defects contained in the conductive film inside the recess has been reduced, an annealing process after the removing step is performed with the surface of the conductive film exposed, thereby releasing defects in the conductive film more easily. Accordingly, it is possible to avoid the agglomeration of defects in the surface of the conductive film inside the recess. Moreover, by performing annealing separately before and after the removing step, defects contained in the conductive film are gradually eliminated, so that the conductive film does not shrink unevenly. As a result, it is possible to grow the crystal of the conductive film fully, while preventing the occurrence of a surface fracture or a crack in the conductive film to serve as wiring due to the agglomeration of defects or the shrinkage of the conductive film.

Therefore, with the inventive method for forming a wiring structure, a wiring structure including neither a void nor a surface fracture is achieved, thereby making it possible to fabricate an electronic device such as a highly-reliable semiconductor device with a good yield.

In the inventive method for forming a wiring structure, the recess may include: a hole; and a wiring groove formed on the hole and connected to the hole. Then, a highly-reliable wiring structure having a dual damascene structure is achieved.

In such a case, it is preferable that in a state that the conductive film has been subjected to the first heat treatment, crystal grains in part of the conductive film inside the hole are smaller than crystal grains in part of the conductive film inside the wiring groove, and the crystal grains in the part of the conductive film inside the wiring groove are smaller than crystal grains in part of the conductive film outside the recess. That is to say, it is preferable that respective parts of the conductive film outside the recess, in the wiring groove and in the hole gradually decrease in the size of crystal grains in this order. In other words, it is preferable that respective parts of the conductive film outside the recess, in the wiring groove and in the hole have their crystal growths suppressed to an increasing extent in this order. This ensures the prevention of a void occurring in respective parts of the conductive film inside the hole and the wiring groove in a state that the conductive film has been subjected to the first heat treatment.

In the inventive method for forming a wiring structure, it is preferable that the crystal growth of part of the conductive film inside the recess is incomplete in a state that the conductive film has been subjected to the first heat treatment, whereas the crystal growth of the conductive film inside the recess is completed in a state that the conductive film has been subjected to the second heat treatment. This ensures the prevention of a void occurring in respective parts of the conductive film inside the hole and the wiring groove in a state that the conductive film has been subjected to the first heat treatment. In addition, in a heat treatment performed after the second heat treatment, further crystal growth of the conductive film does not occur inside the recess, thus preventing the shrinkage of the conductive film and the occurrence of, for example, a surface fracture due to the shrinkage.

In the inventive method for forming a wiring structure, it is preferable that in a state that the conductive film has been subjected to the first heat treatment, crystal grains in part of the conductive film inside the recess are smaller than crystal grains in part of the conductive film outside the recess. That is to say, it is preferable to suppress the crystal growth of part of the conductive film inside the recess to a greater extent than that outside the recess. This ensures the prevention of a void occurring in the part of the conductive film inside the recess in a state that the conductive film has been subjected to the first heat treatment.

In the inventive method for forming a wiring structure, the second heat treatment is preferably performed at a temperature higher than the first heat treatment. That is to say, the first heat treatment is preferably performed at a relatively low temperature (e.g., about 100 to 200° C.) and the second heat treatment is preferably performed at a relatively high temperature (e.g., about 200 to 500° C.). Then, it is possible to suppress the crystal growth of part of the conductive film inside the recess to prevent the occurrence of a void, while growing the crystal of part of the conductive film outside the recess fully, during the first heat treatment. Accordingly, the surface of the conductive film to be a contact surface to, for example, a polishing pad in the removing step is stabilized, thereby preventing the film surface from peeling off or a distortion from occurring in the removing step. This suppresses variation in polishing rate among wafers, thus planarizing the surface of the conductive film uniformly. In addition, during the second heat treatment, the crystal of the conductive film is grown fully inside the recess, thus allowing densification of the conductive film. Accordingly, further crystal growth of the conductive film does not occur inside the recess in a heat treatment performed after the second heat treatment, thereby preventing the shrinkage of the conductive film and the occurrence of, for example, a surface fracture due to the shrinkage.

In the inventive method for forming a wiring structure, the second heat treatment is preferably performed for a period of time longer than the first heat treatment. That is to say, the first heat treatment is preferably performed for a relatively short period of time and the second heat treatment is preferably performed for a relatively long period of time. Then, it is possible to suppress the crystal growth of the conductive film inside the recess to prevent the occurrence of a void, while growing the crystal of the conductive film fully outside the recess, in the first heat treatment. Accordingly, the surface of the conductive film to be a contact surface to, for example, a polishing pad in the removing step is stabilized, thereby preventing the film surface from peeling off or a distortion from occurring in the removing step. This suppresses variation in polishing rate among wafers, thus planarizing the surface of the conductive film uniformly. In addition, with the second heat treatment, the crystal of the conductive film is fully grown inside the recess, thus allowing densification of the conductive film. Accordingly, further crystal growth of the conductive film does not occur inside the recess in a heat treatment performed after the second heat treatment, thereby preventing the shrinkage of the conductive film and the occurrence of, for example, a surface fracture due to the shrinkage.

In the inventive method for forming a wiring structure, if the recess has a width of 0.25 $\mu$m or less, the advantages described above are remarkably exhibited.

In the inventive method for forming a wiring structure, if the conductive film is made of copper or an alloy containing copper, highly-reliable buried copper wiring is achieved.

In the inventive method for forming a wiring structure, if a chemical mechanical polishing process is used in the step of removing the part of the conductive film located outside the recess, the part of the conductive film outside the recess can be removed as intended.

An inventive method for fabricating an electronic device is predicated upon a method for fabricating an electronic device including a first wiring structure and a second wiring structure. Specifically, a method for forming the first wiring structure includes the steps of: forming a first recess in a first insulating film formed on a substrate; depositing a first conductive film over the first insulating film such that the first recess is filled with the first conductive film; subjecting the first conductive film to a first heat treatment; removing part of the first conductive film located outside the first recess, after the first heat treatment has been performed; and subjecting the remaining part of the first conductive film to a second heat treatment with the surface thereof exposed, after the part of the first conductive film located outside the first recess has been removed. A method for forming the second wiring structure includes the steps of: forming a second recess in a second insulating film formed on the substrate; depositing a second conductive film over the second insulating film such that the second recess is filled with the second conductive film; subjecting the second conductive film to a third heat treatment; and removing part of the second conductive film located outside the second recess. The second recess has a width greater than the first recess. In the method for fabricating the second wiring structure, the third heat treatment may be performed after the deposition of the second conductive film and before the step of removing part of the conductive film, or may be performed after the removing step.

With the inventive method for fabricating an electronic device, the inventive method for forming a wiring structure is used to form the first wiring structure in a first recess with a relatively small width of 0.25 μm or less, for example, and therefore the above-described advantages in the method are also obtained. On the other hand, to form a second wiring structure in a second recess with a relatively large width greater than 0.25 μm, for example, "annealing" is performed only one time "before a CMP process" or "after the CMP process", considering that defects are easily released from the conductive film inside a wide recess. Accordingly, it is possible to achieve a wiring structure including neither a void nor a surface fracture, while suppressing increasing in the number of processes.

That is to say, with the inventive method for fabricating an electronic device, the number of annealing processes for forming a wiring structure is selectively set, so that it is possible to form a desired wiring structure, without increasing the number of processes excessively.

DESCRIPTION OF THE PREFERRED EMBODIMENTS

Embodiment 1

Hereinafter, a method for fabricating an electronic device according to a first embodiment of the present invention will be described with reference to the drawings. This embodiment is characterized in that an annealing process is performed on a copper (Cu) film to serve as wiring one time "before a CMP process" and one time "after the CMP process".

FIGS. 1 through 7 are cross-sectional views showing respective process steps of a method for fabricating an electronic device of the first embodiment.

Figure 1:
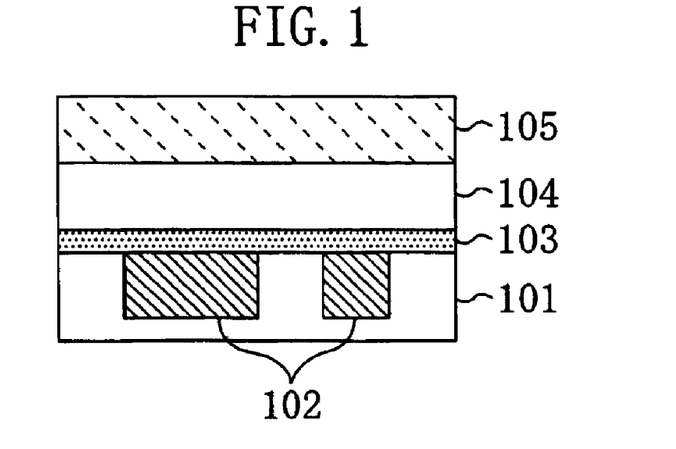
FIG. 1 is a cross-sectional view showing a process step of a method for fabricating an electronic device according to a first embodiment of the present invention.

First, as shown in FIG. 1, a lower wiring layer 102 is formed in an insulating film 101 deposited over, for example, a semiconductor substrate (not shown), and then the surface of the insulating film 101 in which the lower wiring layer 102 has been buried is planarized. Then, an SiN film 103, a $SiO_2$ film 104 and a FSG film 105 are deposited in this order by, for example, a CVD process over the planarized insulating film 101 and the lower wiring layer 102.

Figure 2:
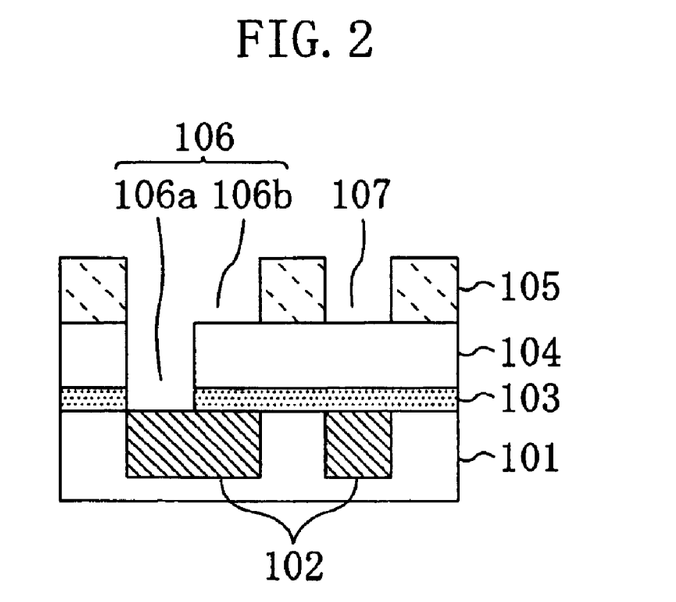
FIG. 2 is a cross-sectional view showing a process step of the method for fabricating the electronic device of the first embodiment.

Next, as shown in FIG. 2, a recess (trench) 106 and a wiring groove 107 are formed in the SiN film 103, the $SiO_2$ film 104 and the FSG film 105 with a process such as a lithographic process or a dry etching process. More specifically, the recess 106 is made up of: a via hole 106a formed through the SiN film 103 and the $SiO_2$ film 104 to reach the lower wiring layer 102; and a wiring groove 106b formed in the FSG film 105 and connected to the via hole 106a. That is to say, the recess 106 has a dual damascene structure. The wiring groove 107 is also formed in the FSG film 105 in the same manner as the wiring groove 106b.

Figure 3:
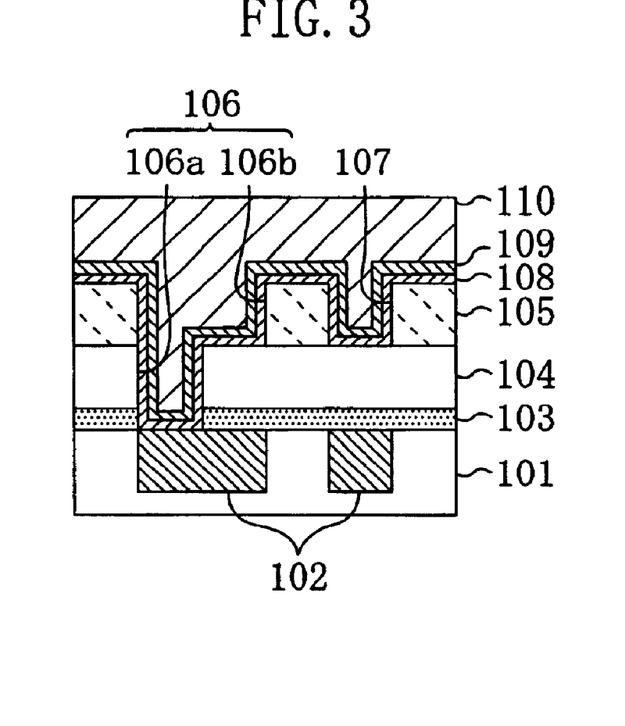
FIG. 3 is a cross-sectional view showing a process step of the method for fabricating the electronic device of the first embodiment.

Thereafter, as shown in FIG. 3, a barrier film 108 and a Cu seed film 109 are deposited by, for example, a physical vapor deposition (PVD) process over the surface of the FSG film 105 and over the walls and the bottoms of the recess 106 and the wiring groove 107 to fill the recess 106 and the wiring groove 107 halfway. Subsequently, a Cu plating film 110 is deposited by, for example, a plating process over the entire surface of the Cu seed film 109 to fill the recess 106 and the wiring groove 107 completely.

Figure 4:
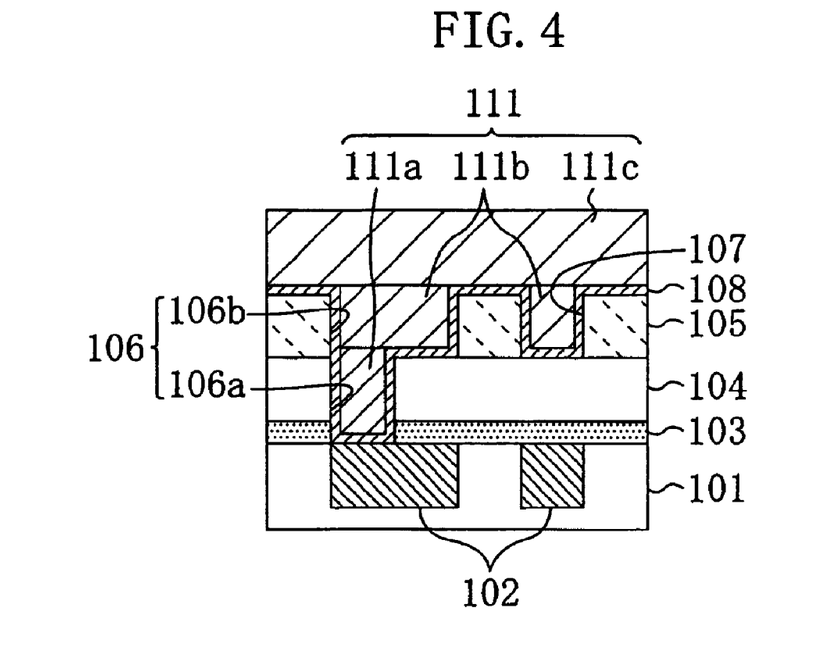
FIG. 4 is a cross-sectional view showing a process step of the method for fabricating the electronic device of the first embodiment.

Then, a first annealing process is performed on the Cu seed film 109 and the Cu plating film 110. In this case, the annealing process is performed at a temperature of, e.g., 150° C. for, e.g., 30 minutes. In this manner, as shown in FIG. 4, the boundary between the Cu seed film 109 and the Cu plating film 110 disappears, thereby forming a Cu film 111 as a result of merging the Cu seed film 109 and the Cu plating film 110 together. It should be noted that the microstructure of the Cu film 111 differs among portions. Specifically, the crystal growth of the Cu film 111 varies in degree among a portion inside the via hole 106a, a portion inside the wiring grooves 106b and 107 and a portion outside the wiring grooves 106b and 107, respectively. Therefore, the Cu film 111 includes: a Cu film 111a having small crystal grains in the via hole 106a; a Cu film 111b having middle-sized crystal grains in the wiring grooves 106b and 107; and a Cu film 111c whose crystal growth has been completed outside the wiring grooves 106b and 107.

In order to form the Cu film 111 having such a three-layer structure as described above, it is preferable to use a minimum heat load enough to grow the crystal grains in the uppermost Cu film 111c fully in the first annealing process. More specifically, the annealing temperature is preferably set in the range greater than or equal to 100° C. and less than 200° C. and the annealing time is preferably set in the range from 30 to 180 minutes, both inclusive. By using such annealing conditions, the intermediate Cu film 111b is in a state that the crystal growth has proceeded to some extent, while the lowermost Cu film 111a is in a state that the crystal growth has hardly proceeded yet.

Figure 5:
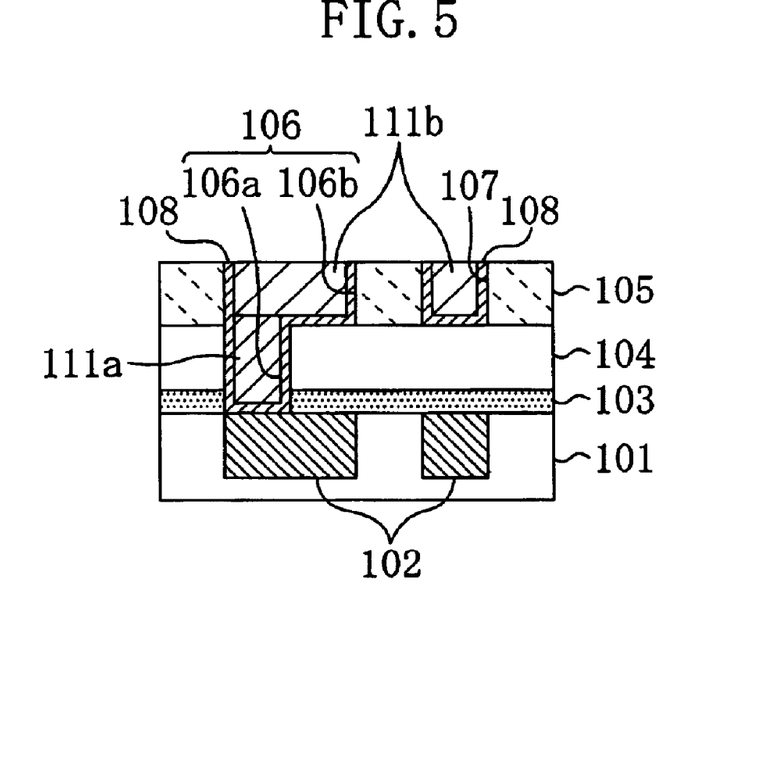
FIG. 5 is a cross-sectional view showing a process step of the method for fabricating the electronic device of the first embodiment.

Thereafter, as shown in FIG. 5, a CMP process, for example, is performed to remove respective parts of the Cu film 111c and the barrier film 108 extending off the wiring grooves 106b and 107 (i.e., located above the upper surface of the FSG film 105) so that the surface of the FSG film 105 is exposed, and at the same time, to planarize the surface of the FSG film 105 in which the Cu films 111a and 111b are buried. In this case, specific CMP conditions are as follows.

In the CMP for the Cu film 111, a neutral slurry containing, for example, a siliceous solid matter (at a concentration of 5 mass %) and using a hydrogen peroxide solution as an oxidizing agent is used as a slurry, and the number of revolutions (i.e., relative velocity of a polishing pad [time average] to the wafer surface; the same hereinafter) and the pressure (i.e., the pressure with which the polishing pad is pressed against the wafer; the same hereinafter) in polishing are set at, for example, 1015 mm/sec. and 17.7 kPa, respectively. In the CMP for the barrier film 108, a neutral slurry containing, for example, a siliceous solid matter (at a concentration of 5 mass %) and using a hydrogen peroxide solution as an oxidizing agent (where the solid matter or a neutral component thereof is made of a different material from the slurry used for the Cu film) is used as a slurry, and the number of revolutions and the pressure in polishing are set at 761 mm/sec. and 13.7 kPa, respectively.

Figure 6:
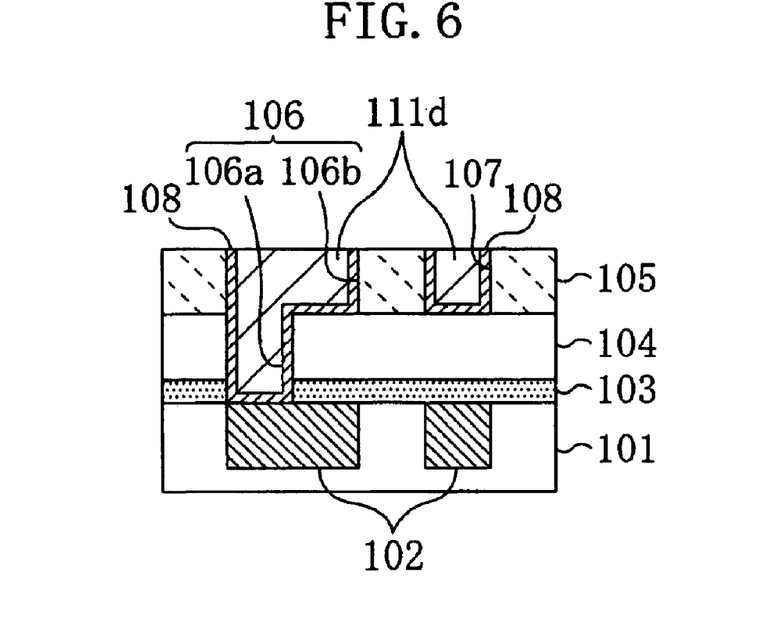
FIG. 6 is a cross-sectional view showing a process step of the method for fabricating the electronic device of the first embodiment.

Subsequently, a second annealing process is performed on the Cu films 111b and 111a. In this case, the annealing temperature is set at, e.g., 300° C. and the annealing time at this temperature is set at, e.g., 120 minutes. In this manner, as shown in FIG. 6, the crystal grains in both of the Cu films 111b and 111a are fully grown, thereby forming an uniform and dense film in which the Cu films 111b and 111a are merged together, i.e., the Cu film 111d. In order to such a dense Cu film 111d, it is preferable to use, in the second annealing process, a heat load greater than that used in the first annealing process before the CMP process (the process step shown in FIG. 5). More specifically, the annealing temperature is preferably set in the range greater than or equal to 200° C. and less than 500° C., and the annealing time is preferably set in the range from 60 to 240 minutes, both inclusive.

Figure 7:
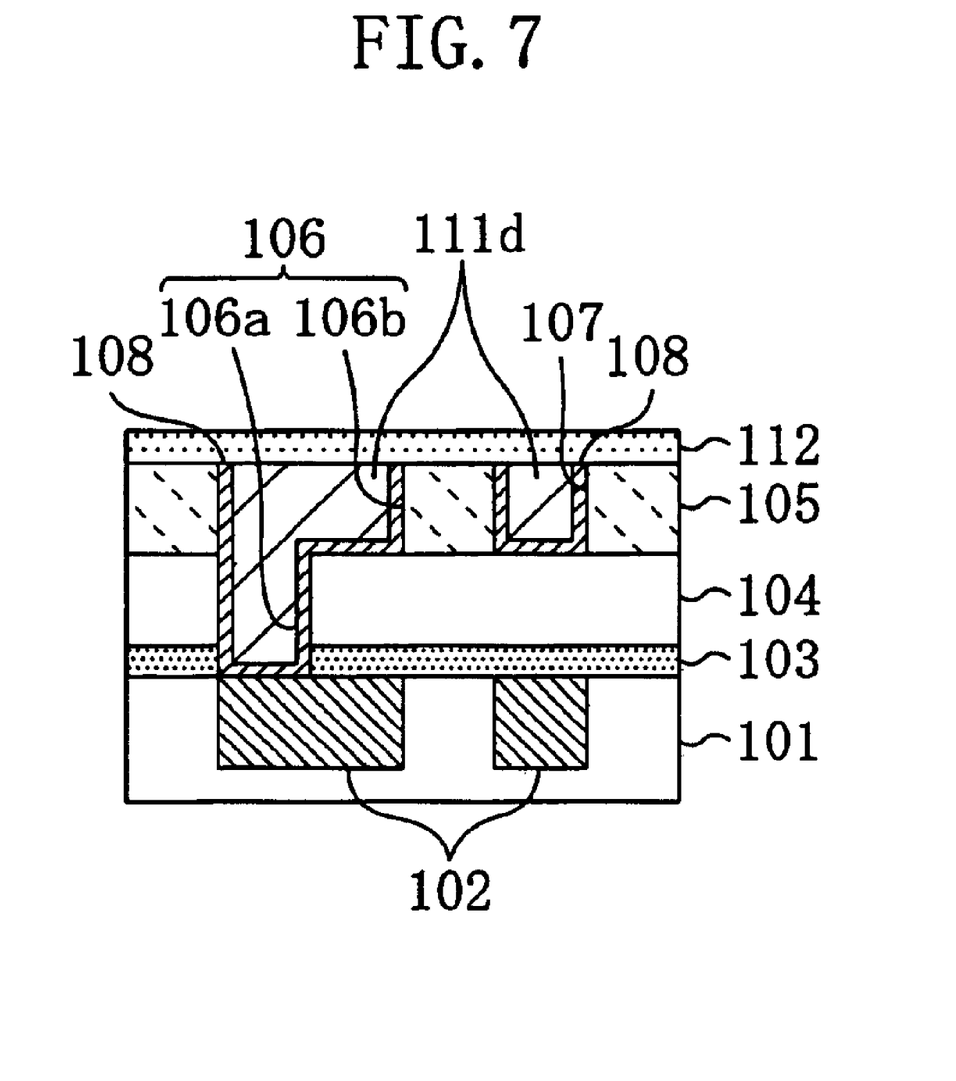
FIG. 7 is a cross-sectional view showing a process step of the method for fabricating the electronic device of the first embodiment.

Lastly, to prevent the surface oxidation of the Cu film 111d, a SiN film 112 is formed by, for example, a CVD process over the FSG film 105 and the Cu film 111d as shown in FIG. 7. In this manner, a multilevel wiring structure including the lower wiring layer 102 and an upper wiring layer made of the Cu film 111d buried in the wiring grooves 106b and 107. At this time, the upper wiring layer and the lower wiring layer 102 are connected to each other via a plug made of the Cu film 111d buried in the via hole 106a. By repeating the same process steps as described above (see FIGS. 1 through 7), an electronic device such as a semiconductor device having a multilevel wiring structure with a desired number of levels can be fabricated.

Hereinafter, the two annealing processes (i.e., the first and second annealing processes), which are a feature of this embodiment, will be described in detail.

As shown in FIG. 4, the first annealing process is characterized in forming the Cu film 111 having the three-layer structure with different crystal-grain sizes. The as-deposited Cu plating film 110 (see FIG. 3) deposited by a plating process includes a lot of defects. If the first annealing process is performed at this time, the Cu seed film 109 and the Cu plating film 110 are merged together, thereby forming a Cu film 111. For more details as to the state of the Cu film 111, the Cu film 111a (via portion) located inside the via hole 106a has a relatively small crystal-grain size, whereas the Cu film 111b (wiring portion) located inside the wiring grooves 106b and 107 has a crystal-grain size greater than that of the Cu film 111a. The Cu film 111c located outside the wiring grooves 106b and 107 has a crystal-grain size greater than any of those of the Cu films 111a and 111b. That is to say, the Cu film 111c is in a state that the crystal growth has been completed. The Cu film 111 having such a three-layer structure as described above is obtained because of the following reasons.

In the first annealing process performed at a temperature of about 150° C., crystal grains in the Cu film 111 are grown at a relatively low speed in the whole because the annealing temperature is relatively low. In particular, since the Cu film 111a is surrounded by the insulating film 104 serving as a wall of the via hole 106a, the crystal growth of the Cu film 111a is prevented, so that crystal grains are hardly grown. On the other hand, since the Cu film 111b is present in the wiring grooves 106b and 107 that are relatively wide as compared to the Cu film 111a, the crystal growth of the Cu film 111b is less prevented by the surroundings, so that crystal grains are easily grown. Further, the Cu film 111c is adjacent to basically no films in the lateral direction, so that the crystal growth is much less prevented. Accordingly, crystal grains with a large grain size can be grown even at an annealing temperature of about 150° C. As a result, the crystal growth of the Cu film 111c is completed while the annealing temperature of about 150° C. is kept for 30 minutes. In this manner, the Cu film 111 after the first annealing process, i.e., a metal film for wiring, acquires the state (three-layer structure) in which the Cu film 111a, the Cu film 111b and the Cu film 111c have the size of crystal grains increased in this order, as shown in FIG. 4.

The crystal growth of the Cu film 111c, which is to be removed by a CMP process (see FIG. 5) following the first annealing process, has been completed at the time when the first annealing process is finished, as described above. Thus, the surface of the Cu film 111c to be a contact surface to a polishing pad is stabilized, thereby avoiding, for example, peeling off of the film surface and distortion during the CMP process. Accordingly, it is possible to suppress variation in polishing rate among wafers, resulting in uniformly planarized surface of the conductive film. That is to say, it is possible to prevent excessive polishing which increases the wiring resistance or to prevent insufficient polishing which causes unwanted continuity between wires.

Next, the second annealing process will be described specifically. The second annealing process is performed for the purpose of obtaining a dense Cu film 111d, which has been buried in, for example, the recess 106 before the deposition of the SiN film 112. In this way, it is possible to prevent a tensile stress from occurring in the Cu film 111d during a process step after the second annealing process, thereby eliminating harmful effects on the device resulting from the tensile stress.

At the time of the second annealing process, the Cu film 111c located outside the recess 106 and the wiring groove 107 has been removed by the CMP process performed before the second annealing process, as shown in FIG. 5. That is to say, the recess 106 and the wiring groove 107 are completely filled with the Cu film 111 having, inside the recess 106, a two-layer structure made up of the Cu films 111a and 111b whose crystal grains mutually differing in size.

In view of this, in order to complete the crystal growth of the Cu film 111, the second annealing process is performed. At this time, the Cu film 111 has already been subjected to the first annealing process, so that defects contained in the Cu film 111b located in the wiring grooves 106b and 107 have been already eliminated in part. That is to say, the amount of defects contained in the entire part of the Cu film 111 located inside the recess 106 and the wiring groove 107 decreases as compared to that before the first annealing process. In addition, the Cu film 111c has been removed by the CMP process so that the surface of the Cu film 111b has been exposed. Therefore, it is easier to release defects from the Cu film 111b in the second annealing process. Moreover, the removal of the Cu film 111c reduces the distance between the Cu film 111a and the exposed surface of the Cu film 111 (i.e., the exposed surface of the Cu film 111b), so that defects contained in the Cu film 111a are easily released from the exposed surface by the second annealing process.

As a result, even if the second annealing process is performed at a relatively high temperature of, e.g., about 300° C., defects can be easily released from the Cu film 111 inside the recess 106 and the wiring groove 107. Therefore, it is possible to prevent defects from agglomerating in the surfaces of the Cu film 111 inside the recess 106 and the wiring groove 107, respectively. In addition, by performing annealing processes separately before and after the CMP process, defects contained in the Cu film 111 are gradually eliminated, so that the Cu film 111 does not shrink unevenly. Accordingly, it is possible to complete the crystal growths of the Cu films 111b and 111a, while preventing a surface fracture, a crack and the like resulting from the agglomeration of defects or the shrinkage of the Cu film 111, thus forming a uniform and dense Cu film 111d. Moreover, since the crystal growths of the Cu films 111a and 111b, i.e., the Cu film 111d, are completed in the second annealing process, further crystal growth of the Cu film 111d will not occur in a process step (e.g., a heat treatment process) performed after the second annealing process. Therefore, it is possible to prevent the shrinkage of the Cu film 111d and a surface fracture and a crack, for example, resulting from the shrinkage.

As has been described above, according to the first embodiment, respective crystals of a Cu film inside a wiring groove and of a Cu film outside the wiring groove (i.e., a Cu film formed on an insulating film) are grown by a first annealing process with no voids created in a relatively narrow via hole. Specifically, the first annealing process is not strong but gentle, and therefore, the agglomeration of defects in the Cu film in the via hole and the Cu film in the wiring groove is suppressed, resulting in that it is possible to grow the crystals of the respective Cu films to some extent without creating voids in the Cu films. In addition, the crystal in the Cu film formed on the insulating film has been fully grown, so that a CMP process can be performed on the Cu film uniformly after the first annealing process without varying among wafers.

In the first embodiment, the second annealing process after the CMP process allows the crystal of the Cu film inside the wiring groove, for example, to be fully grown with no fractures, for example, created in the surface of the Cu film buried in the wiring groove and the via hole. Specifically, defects in the Cu film are partially eliminated by annealing (i.e., the first annealing process) before the CMP process, thus reducing the amount of defects contained in the Cu film inside the wiring groove, for example. Thereafter, the CMP process and the second annealing process are performed in this order. In other words, since the second annealing process is performed with the surface of the Cu film inside the wiring groove, for example, exposed after the amount of defects in the Cu film has been reduced, the defects in the Cu film are easily released, thereby preventing the defects from agglomerating in the surface of the Cu film. In addition, since the annealing processes are performed separately before and after the CMP process, defects contained in the Cu film are gradually eliminated, so that the Cu film does not shrink unevenly. As a result, it is possible to grow the crystals in the Cu film, which will serve as wiring, to full extent, while preventing a surface fracture and a crack from occurring in the Cu film resulting from the agglomeration of defects or the shrinkage of the Cu film.

Moreover, the second annealing process completes the crystal growth of the Cu film inside the wiring groove, for example, so that the crystal growth of the Cu film does not occur any more in a process such as a heat treatment performed after the second annealing process, thereby preventing the occurrence of a stress associated with the crystal growth and also preventing harmful effects on the device resulting from the stress.

Accordingly, in the first embodiment, a wiring structure (buried copper wiring) without voids and surface fractures is achieved, thus fabricating a highly-reliable semiconductor device with a good yield.

The presence of, for example, a tiny void and a surface fracture has a greater influence on the whole of the device as the design sizes of, for example, the via hole and the wiring groove decrease. Accordingly, if the width of the wiring groove or hole in which a Cu film is to be buried is about 0.25 μm or less, the advantages of the first embodiment described above are remarkably exhibited. Considering the limitation of burial in a process such as a plating process, the recess in which a Cu film is to be buried preferably has a width of 0.05 μm or more.

In the first embodiment, Cu films are used as a conductive film for wiring. Alternatively, an Al film, an Ag film or an alloy film containing Cu, Al or Ag may be used. In such a case, the same advantages are obtained. The type of the barrier film is not specifically limited. For example, a TaN barrier film or a Ta barrier film may be used.

In the first embodiment, an annealing process is performed on a Cu film to serve as wiring one time "before a CMP process" and one time "after the CMP process". Alternatively, an annealing process may be performed at a plurality of times "before the CMP process" so as not to cause a void in the Cu film inside a wiring groove and a hole. In addition, an annealing process may be performed at a plurality of times "after the CMP process" so as to fully grow the crystal of the Cu film inside the wiring groove and the hole.

Embodiment 2

Hereinafter, a method for fabricating an electronic device according to a second embodiment of the present invention will be described with reference to the drawings. This embodiment is characterized in that the number of annealing processes for forming a wiring structure is selectively set in accordance with the width of a recess to be a wiring groove, for example. This embodiment has such a feature because of the following reasons.

Specifically, in most of the multilevel wiring structures, the wiring width is smaller at lower-level wiring and the wiring width is relatively larger in upper-level wiring in general. Accordingly, if wiring is formed by burying conductive films in, for example, wiring grooves, drawbacks such as voids are more liable to occur at lower-level wiring with narrow wiring grooves. In addition, since annealing processes are performed in forming respective upper-level wirings, lower-level wiring is subjected to the plurality of annealing processes accordingly after the formation of the lower-level wiring itself. Therefore, a heat load is applied to the lower-level wiring every time each of the annealing processes is performed. That is to say, a heat load is applied to lower-level wiring at a larger number of times. This causes a conductive film for wiring to be easily changed, thereby increasing the probability of occurrence of drawbacks. In view of such circumstances, in this embodiment, "annealing" is performed separately "before and after a CMP process" as in the first embodiment in order to form wiring having a narrow wiring groove, for example, or located at a lower level, thereby gradually crystallizing the conductive film for wiring. On the other hand, in order to form wiring with a wide wiring groove, for example, or located at an upper level, an importance is placed on the reduction of the number of processes so that "annealing" is performed only one time "before a CMP process" or "after the CMP process".

Figure 8:
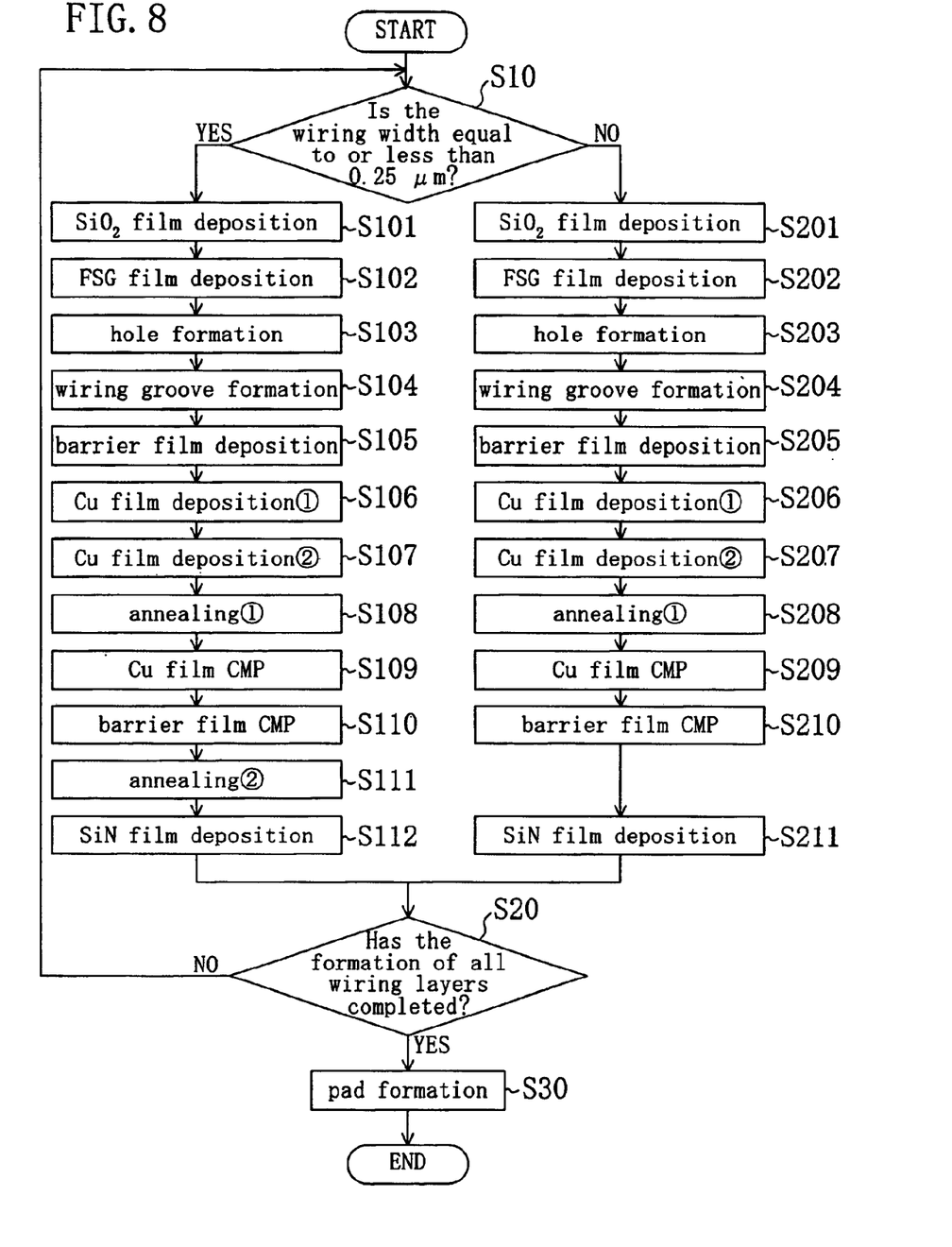
FIG. 8 is a flowchart showing a method for fabricating an electronic device according to a second embodiment of the present invention.

Hereinafter, an example of formation of a multilevel structure for buried copper wiring will be described specifically with reference to a flowchart shown in FIG. 8.

First, in step S10, it is determined whether the width of wiring to be formed (i.e., the width of a wiring groove or the diameter of a via hole or a contact hole) is 0.25 μm or less.

If the wiring width is 0.25 μm or less, the same method as in the first embodiment (see FIGS. 1 through 7) is used. That is to say, an annealing process is performed one time before and one time after a CMP process performed on a conductive film for wiring. In this manner, wiring is formed.

Specifically, in Step S101, a $SiO_2$ film, for example, is deposited over a substrate, and then in Step S102, a FSG film, for example, is deposited over the $SiO_2$ film. Subsequently, in Step S103, a hole is formed in these films.

Next, in Step S104, a wiring groove connected to the hole is formed in the FSG film, and then in Steps S105 and S106, a barrier film and a Cu seed film are deposited in this order over the entire surface of the FSG film to fill the hole and the wiring groove halfway. Thereafter, in Step S107, a Cu plating film is deposited over the Cu seed film to fill the hole and the wiring groove completely.

Subsequently, in Step S108, the respective Cu films are subjected to a first annealing process. In this way, the Cu seed film and the Cu plating film are merged together, and in addition, the crystallization of a surface portion of the Cu film as a result of the mergence is completed. Then, in Step S109 and S110 (a CMP process), respective parts of the Cu film and the barrier film extending off the wiring groove are removed sequentially by a CMP process, thereby forming a buried Cu wire in the FSG film and planarizing the surface of the FSG film.

Then, in Step S111, the Cu wire is subjected to a second annealing process. In this way, the crystal growth of the whole of the Cu films constituting the wiring, i.e., densification of the Cu wire, is completed. Thereafter, in Step S112, a SiN film is deposited over the planarized FSG film in which the Cu wire is buried.

If the diameter of the hole or the width of the wiring groove is 0.25 μm or less, two annealing processes are performed on the Cu film in Steps S101 through S112 because of the following reason. That is to say, since the wiring pattern is minute, it is difficult for only one annealing process to completely eliminate defects contained in the Cu films and it is also difficult for the process to fully complete the crystal growth of the whole of the Cu films.

On the other hand, in Step S10, if it is determined that the width of wiring to be formed is greater than 0.25 μm, an annealing process is performed only one time before a CMP process performed on a conductive film for wiring, for example, thereby forming wiring. In other words, if the diameter of a hole or the width of a wiring groove is greater than 0.25 μm, no annealing process is performed after the CMP process in forming a wiring structure.

Specifically, in Steps S201 through S207, after a $SiO_2$ film and a FSG film, for example, have been deposited over a substrate, a hole is formed in these films, and then a wiring groove connected to the hole is formed in the FSG film, as in Steps S101 through S107. Then, a barrier film and a Cu seed film are deposited in this order over the entire surface of the FSG film to fill the hole and the wiring groove halfway. Thereafter, a Cu plating film is deposited over the Cu seed film to fill the hole and the wiring groove completely.

Subsequently, in Step S208, the respective Cu films are subjected to an annealing process. In this way, the Cu seed film and the Cu plating film are merged together, and the crystallization of the whole of the merged Cu film is completed.

Then, in Step S209 and S210 (a CMP process), respective parts of the Cu film and the barrier film extending off the wiring groove are removed sequentially by a CMP process, thereby forming a buried Cu wire in the FSG film and planarizing the surface of the FSG film. Thereafter, in Step S211, a SiN film is deposited over the planarized FSG film in which the Cu wire is buried.

If the diameter of the hole or the width of the wiring groove is greater than 0.25 μm, i.e., if the wiring width is larger, the area from which defects contained in the conductive film (Cu film) for wiring are released increases accordingly. Therefore, as the wiring width increases, the amount of defects contained in the Cu film increases, whereas the area of the surface of the wiring also increases. Accordingly, defects in the Cu film are more easily released. As a result, by performing an annealing process one time at a high temperature, it is possible to complete the crystal growth of the whole of the Cu films to serve as wiring without causing any void.

After the processes in Steps S101 through S112 or the processes in Steps S201 through S211 have been completed, it is determined whether the formation of all the wiring layers are completed in Step 20. If a wiring layer yet to be formed is still exist, the process returns to Step S10. If the formation of all the wiring layers have been completed, the process proceeds to Step S30 in which pads are formed on the uppermost wiring layer and finishing heat treatment is performed.

As described above, in the second embodiment, the method of the first embodiment is used to form wiring in a recess having a relatively small width of 0.25 μm or less, for example, so that the same advantages as in the first embodiment are obtained. On the other hand, to form wiring in a recess having a relatively large width greater than 0.25 μm, for example, "annealing" is performed only one time "before a CMP process", considering that defects are easily released from a conductive film inside the wide recess. In this manner, it is possible to achieve a wiring structure having neither a void nor a surface fracture while suppressing the increase in the number of process steps.

That is to say, in the second embodiment, the number of annealing processes for forming a wiring structure is selectively set in accordance with the wiring width. Therefore, it is possible to form a desired wiring structure without increasing the number of process steps excessively.

In the second embodiment, "annealing" is performed only one time "before a CMP process" to form wiring in a wide recess. Alternatively, "annealing" may be performed only one time "after a CMP process".

In the second embodiment, the Cu films are used as a conductive film for wiring. Alternatively, an Al film, an Ag film or an alloy film containing Cu, Al or Ag may be used. In such a case, the same advantages are obtained. The type of the barrier film is not specifically limited. For example, a TaN barrier film or a Ta barrier film may be used.

What is claimed is:

1. A method for forming a wiring structure, the method comprising the steps of:

forming a recess in an insulating film, said recess including a hole and a wiring groove formed on the hole and connected to the hole;

depositing a conductive film over the insulating film such that the recess is filled with the conductive film;

forming the conductive film having at least three regions with different crystal grain sizes by a first heat treatment;

removing part of the conductive film located outside the recess, after the first heat treatment has been performed; and subjecting the remaining part of the conductive film to a second heat treatment with the surface thereof exposed, after the part of the conductive film located outside the recess has been removed.

2. The method of claim 1, wherein in a state that the conductive film has been subjected to the first heat treatment, crystal grains in part of the conductive film inside the hole are smaller than crystal grains in part of the conductive film inside the wiring groove, and the crystal grains in the part of the conductive film inside the wiring groove smaller than crystal grains in part of the conductive film outside the recess.

3. The method of claim 1, wherein in a state that the conductive film has been subjected to the first heat treatment, crystal grains in part of the conductive film inside the recess are smaller than crystal pains in part of the conductive film outside the recess.

4. The method of claim 1, wherein the second heat treatment is performed at a temperature higher than the first heat treatment.

5. The method of claim 4, wherein the first heat treatment is performed at a temperature higher than or equal to 100° C. and less than 200° C.

6. The method of claim 4, wherein the second heat treatment is performed at a temperature higher than or equal to 200° C. and less than 500° C.

7. The method of claim 1, wherein the second heat treatment is performed for a period of time longer than the first heat treatment.

8. The method of claim 1, wherein the recess has a width of 0.25 µm or less.

9. The method of claim 1, wherein the conductive film is made of copper or an alloy containing copper.

10. The method of claim 1, wherein in the step of removing the part of the conductive film located outside the recess, a chemical mechanical polishing process is used.

11. The method of claim 1, wherein the first heat treatment is 180 minutes or less.

12. The method of claim 1, wherein the second heat treatment is 60 to 240 minutes, inclusive.

13. A The method of claim 1, wherein the first heat treatment is 30 minutes or more.

14. A method for forming a wiring structure comprising the steps of:

forming a recess in an insulating film formed on a substrate;

depositing a conductive film on the insulating film such that the recess is filled with the conductive film;

removing part of the conductive film located outside the recess; and selectively subjecting the conductive film to one or more heat treatments, the number of heat treatments being set in accordance with the width of the recess, wherein the conductive film filled in the recess having a width that is equal to or less than 0.25 µm is subjected to at least two heat treatments, and the conductive film is formed to have at least three regions with different crystal grain sizes by a first heat treatment of the at least two heat treatments, before the step of removing part of the conductive film located outside the recess.

15. The method of claim 14, wherein if the recess has a width that is equal to or less than 0.25 µm, then the conductive film is subject to a first heat treatment before the step of removing part of the conductive film located outside the recess, and, the remaining part of the conductive film is subject to a second heat treatment with the surface thereof exposed after the part of the conductive film located outside the recess has been removed.

16. The method claim 14, further comprising the step of depositing a second insulating film on the surface of the conductive film, wherein if the recess has a width greater than 0.25 µm, then the conductive film is subject to only one heat treatment during the period before the step of depositing the second insulating film.

17. The method of claim 16, wherein the heat treatment is before the step of removing put of the conductive film located outside the recess.

18. The method of claim 16, wherein the remaining part of the conductive film is subject to the heat treatment with the surface thereof exposed after the part of the conductive film located outside the recess has been removed.

19. The method of claim 14, wherein the conductive film formed in the top layer of multi layers is subjected to one annealing.

* * * * *